(12) United States Patent
More

(10) Patent No.: US 11,854,831 B2
(45) Date of Patent: Dec. 26, 2023

(54) CLEANING PROCESS FOR SOURCE/DRAIN EPITAXIAL STRUCTURES

(71) Applicant: Taiwan Semiconductor Manufacturing Co., Ltd., Hsinchu (TW)

(72) Inventor: Shahaji B. More, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 630 days.

(21) Appl. No.: 17/102,933

(22) Filed: Nov. 24, 2020

(65) Prior Publication Data

US 2022/0165581 A1     May 26, 2022

(51) Int. Cl.
*H01L 21/8249* (2006.01)
*H01L 21/48* (2006.01)
*H01L 21/02* (2006.01)
*H01L 21/8234* (2006.01)

(52) U.S. Cl.
CPC .... *H01L 21/4835* (2013.01); *H01L 21/02636* (2013.01); *H01L 21/8249* (2013.01); *H01L 21/823431* (2013.01)

(58) Field of Classification Search
None
See application file for complete search history.

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 2011/0147828 A1* | 6/2011 | Murthy | H01L 29/66795 257/E21.409 |
| 2016/0293750 A1* | 10/2016 | Kim | H01L 29/7848 |
| 2020/0168723 A1* | 5/2020 | Hsu | H01L 21/02507 |

* cited by examiner

*Primary Examiner* — Suberr L Chi
*Assistant Examiner* — Carnell Hunter, III
(74) *Attorney, Agent, or Firm* — Sterne, Kessler, Goldstein & Fox P.L.L.C.

(57) ABSTRACT

The present disclosure describes a method of forming an epitaxial layer on a substrate in a chamber. The method includes cleaning the chamber with a first etching gas and depositing the epitaxial layer on the substrate. Deposition of the epitaxial layer includes epitaxially growing a first portion of the epitaxial layer with a precursor, cleaning the substrate and the chamber with a flush of a second etching gas different from the first etching gas, and epitaxially growing a second portion of the epitaxial layer with the precursor. The first portion and the second portion have the same composition. The method furthers includes etching a portion of the epitaxial layer with a third etching gas having a flow rate higher than that of the second etching gas.

20 Claims, 14 Drawing Sheets

__ US 11,854,831 B2 __

CLEANING PROCESS FOR SOURCE/DRAIN EPITAXIAL STRUCTURES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

DETAILED DESCRIPTION

Figure 1:
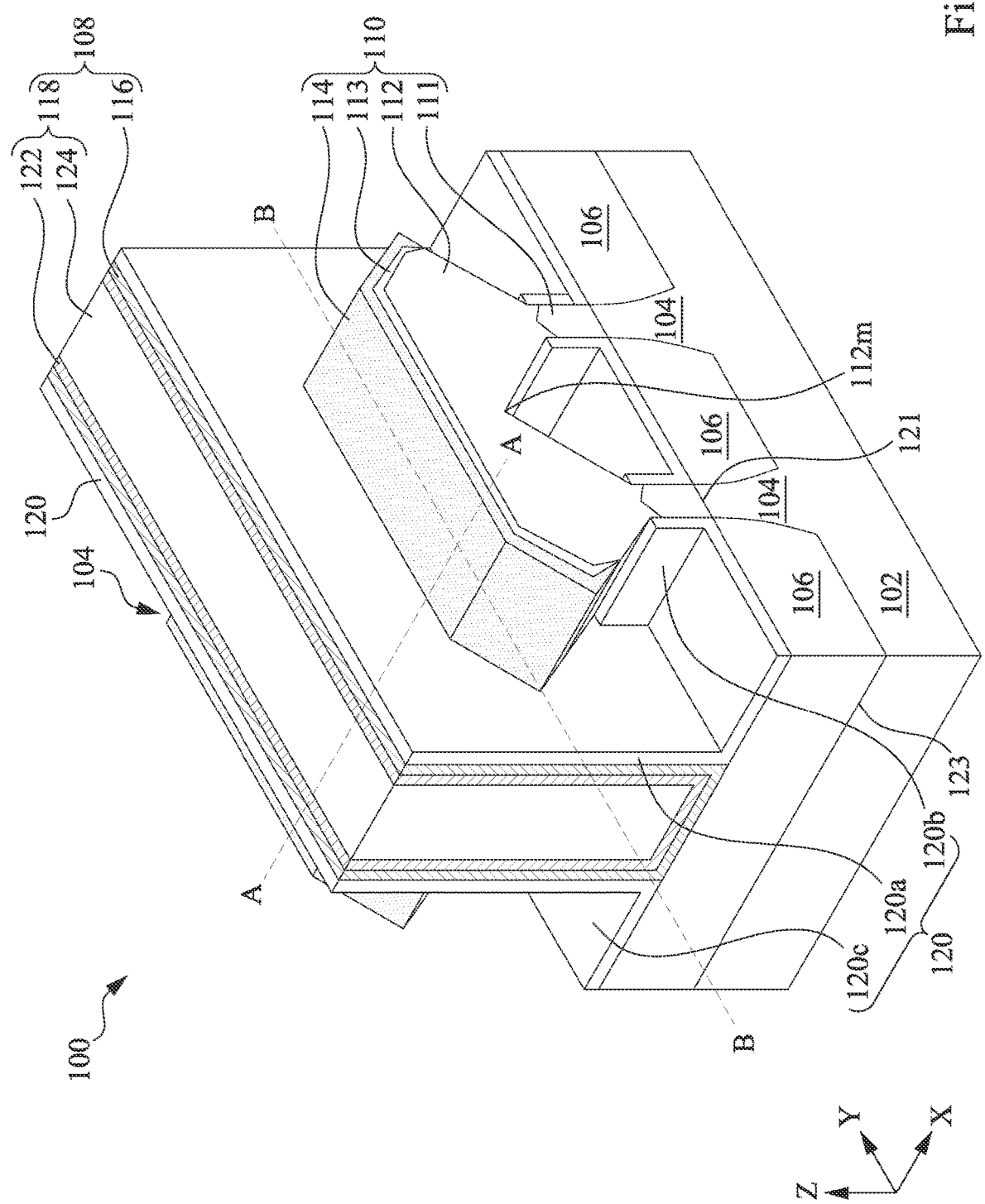
FIG. 1 illustrates an isometric view of a semiconductor device having source/drain (S/D) epitaxial structures formed with optimized cleaning processes, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows, may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, +4%, ±5% of the value). These values are merely examples and are not intended to be limiting. The terms "about" and "substantially" can refer to a percentage of the values, as interpreted by those skilled in relevant art(s) in light of the teachings herein.

The scaling down of FET devices has introduced short-channel effects (SCEs), which can reduce off-state current and device performance of the FET devices. The profiles of source/drain (S/D) epitaxial structures on the FET devices can affect the SCEs, device performance, and process yield. S/D epitaxial structures with larger dimensions can improve device performance, but more epitaxial defects can be formed due to remaining residual gases (e.g., unstable precursor species, such as silanide (SiH3), phosphorus dimer (P-P), and boron (B) precursors) in the epitaxial growth chamber. These remaining residual gases can lead to epitaxial defects, such as unwanted growth of epitaxial structures on fin structures and other structures (e.g., gate structures). In addition, residues (e.g., carbon-containing gas) on fin structures can block epitaxial growth and the fin structure can have missing epitaxial structures. These epitaxial defects can decrease the profile uniformity of the S/D epitaxial structures and negatively affect the device performance and process yield. Reducing epitaxial defects and improving S/D epitaxial structure profile uniformity can be a challenge.

Various embodiments in the present disclosure provide example methods for forming uniform S/D epitaxial structures with optimized cleaning processes in field effect transistors (FET) devices (e.g., finFETs, gate-all-around FETs, MOSFETs, etc.) and/or other semiconductor devices in an integrated circuit (IC) and example semiconductor devices fabricated with the same methods. The example methods in the present disclosure can clean the epitaxial growth chamber at an elevated temperature prior to the introduction of a wafer, bake the wafer and the epitaxial growth chamber in a hydrogen environment, and clean the wafer and the epitaxial growth chamber during the epitaxial growth of the S/D epitaxial structures with one or more flushes of etching gases having a lower flow rate and a shorter time than etching processes of the S/D epitaxial structures. The temperature and etching time of these cleaning processes can be optimized to remove residual gases in the epitaxial growth chamber and thereby reduce epitaxial defects. In some embodiments, after the formation of S/D epitaxial structures, a pumping process at an elevated temperature can further reduce epitaxial defects. As a result of reducing of epitaxial defects, such as missing epitaxial structures and unwanted growth of epitaxial structures, the dimension and profile variations of the SID epitaxial structures on the wafer can be reduced and the profile uniformity of the S/D epitaxial structures on the wafer can be improved. In some embodiments, a variation of the width (e.g., a difference between a maximum width and a minimum width) of the S/D epitaxial structures on the wafer formed with optimized cleaning processes can be reduced to about 2 nm to about 10 nm. A ratio of the variation to the width of S/D epitaxial structures can range from about 5% to about 30%. In some embodiments, the reduction of epitaxial structure defects and improvement of epitaxial structure profile uniformity can increase the process yield by about 5% to about 20%.

Though the present disclosure describes optimized cleaning processes to form uniform S/D epitaxial structures on a finFET, the uniform S/D epitaxial structures and the methods for forming S/D epitaxial structures with the optimized cleaning processes described herein can be applied to other FETs and other semiconductor devices, such as gate-all-around (GAA) FETs and MOSFETs.

Figure 2:
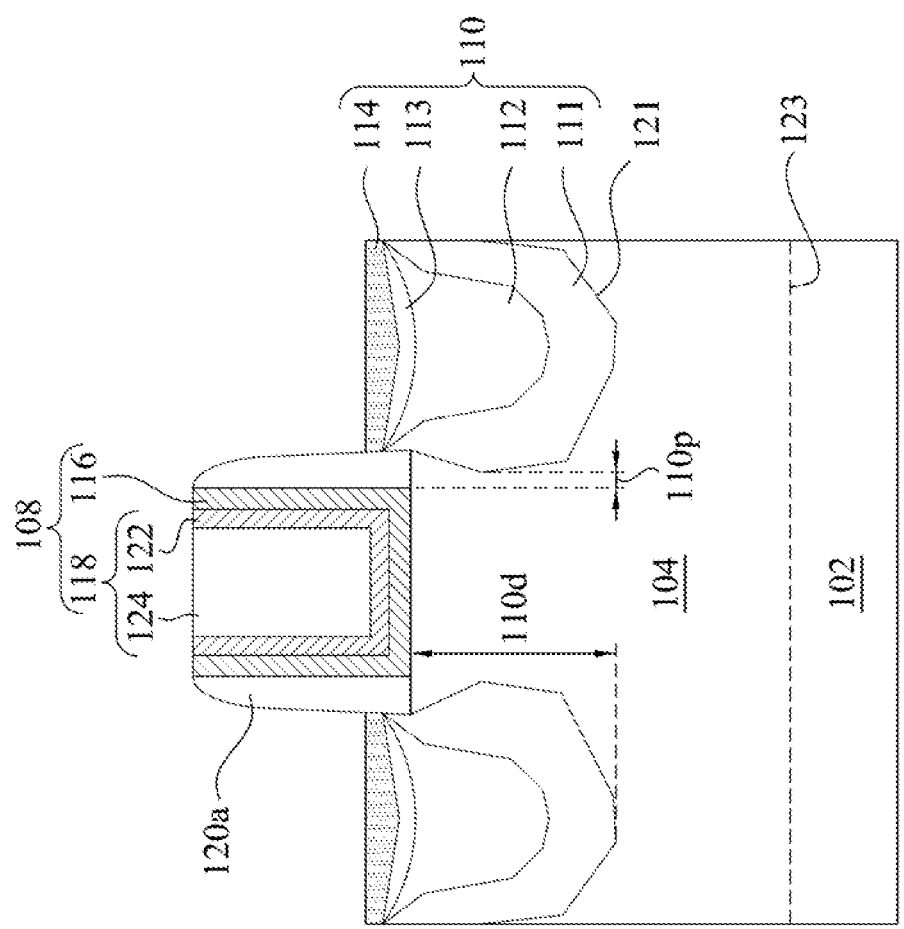
FIGS. 2-4 illustrate cross-sectional views of a semiconductor device having S/D epitaxial structures formed with optimized cleaning processes, in accordance with some embodiments.
Figure 3:
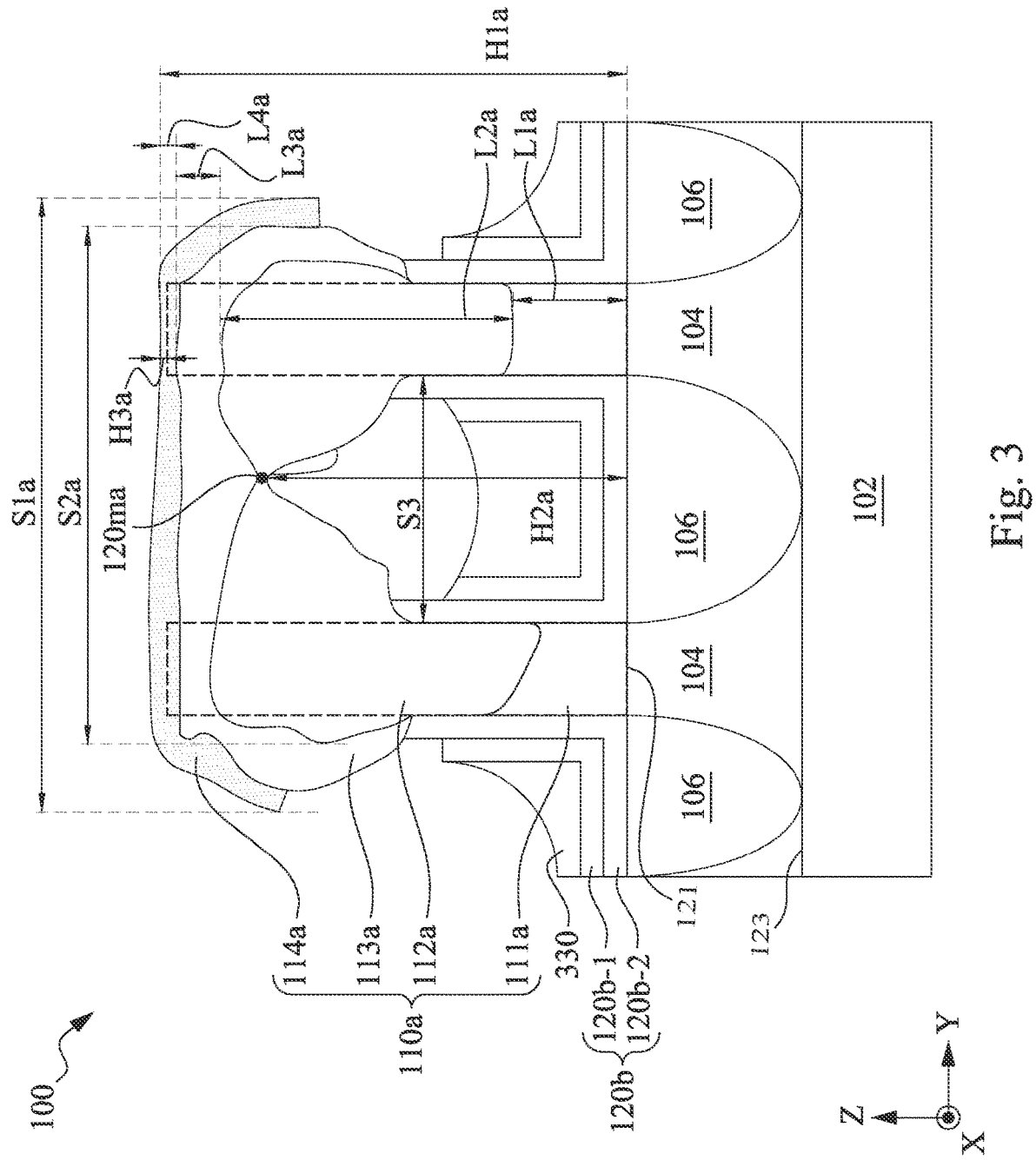
Figure 4:
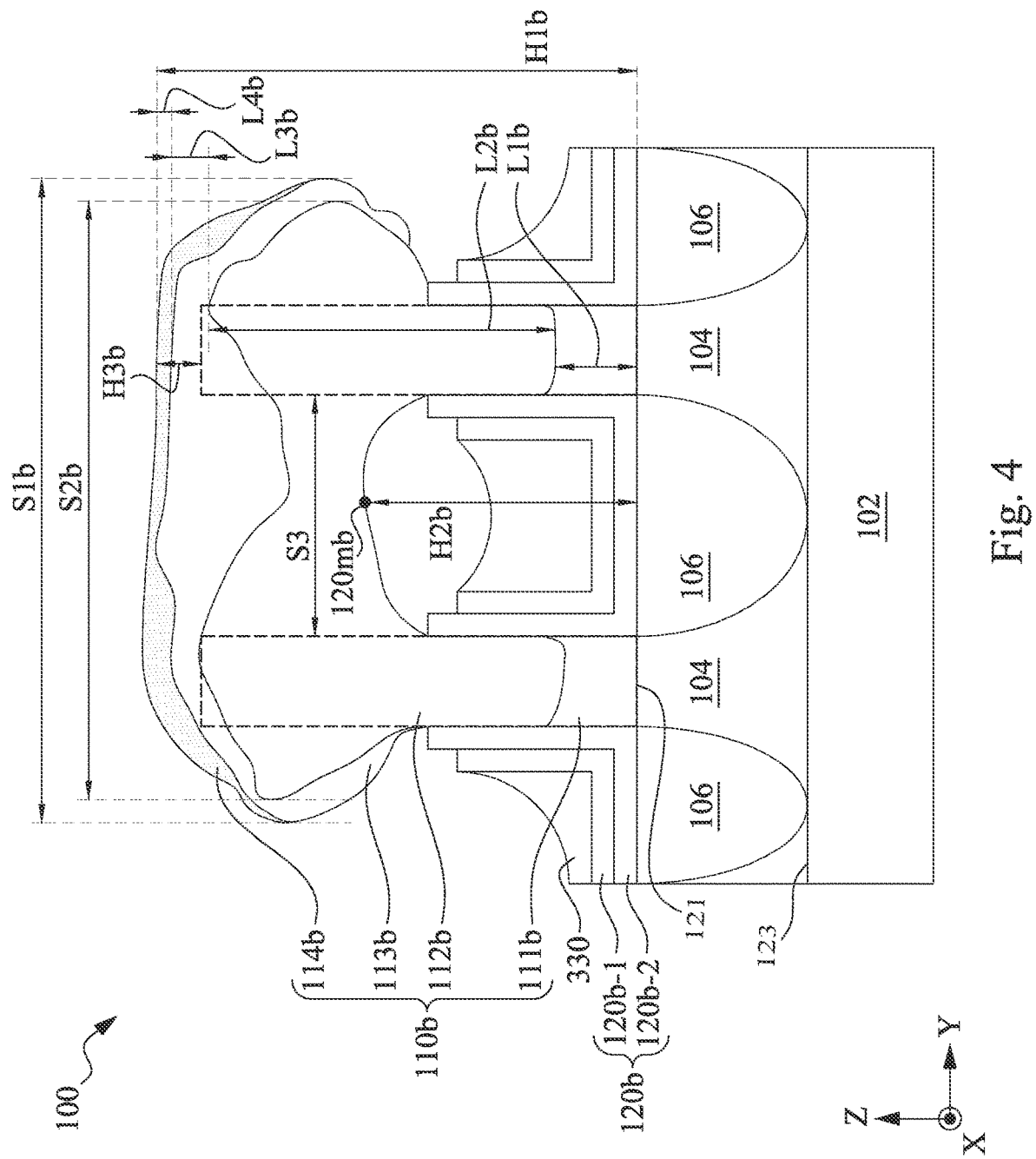

FIG. 1 illustrates an isometric view of a semiconductor device 100 having S/D epitaxial structures 110 formed with optimized cleaning processes, in accordance with some embodiments. FIG. 2 illustrates a cross-sectional view of semiconductor device 100 along line A-A in FIG. 1, in accordance with some embodiments. FIGS. 3 and 4 illustrate cross-sectional views of semiconductor device 100 having n-type and p-type S/D epitaxial structures respectively along line B-B in FIG. 1, in accordance with some embodiments. Referring to FIGS. 1-4, semiconductor device 100 can be formed on a substrate 102 and can include fin structures 104, shallow trench isolation (STI) regions 106, gate structures 108, S/D epitaxial structures 110, and spacers 120. Though FIG. 1 shows one merged S/D epitaxial structures 110 on two fin structures 104 for one FET device, semiconductor device 100 can include one or more FET devices and separate S/D epitaxial structures similar in composition to S/D epitaxial structures 110 on one or more fin structures similar and parallel to fin structures 104. In addition, semiconductor device 100 may be incorporated into the integrated circuit through the use of other structural components such as S/D contact structures, gate contacts, vias, interconnect metal layers, dielectric layers, passivation layers, etc., which are not shown for the sake of clarity.

Substrate 102 can include a semiconductor material, such as silicon. In some embodiments, substrate 102 includes a crystalline silicon substrate (e.g., wafer). In some embodiments, substrate 102 includes (i) an elementary semiconductor, such as germanium; (ii) compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Fin structures 104 can be formed from patterned portions of substrate 102. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the fin structures. As shown in FIGS. 1-4, fin structures 104 can be disposed underlying S/D epitaxial fin structures 110 and gate structures 108 and can extend along an X-axis through gate structures 108. In some embodiments, as shown in FIGS. 3 and 4, adjacent fin structures 104 can have a distance S3 along a Y-axis ranging from about 10 nm to about 50 nm. Fin structures 104 can form the channel regions of semiconductor device 100 and represent current carrying structures of semiconductor device 100. In some embodiments, S/D epitaxial structures 110 can be formed on partially recessed fin regions on substrate 102. These partially recessed fin regions can be partially recessed portions of fin structures 104 that are not underlying gate structures 108. In some embodiments, the removed portions of fin structures 104 can be indicated by dotted boxes shown in FIGS. 3 and 4. Top surfaces of these partially recessed fin regions can form interfaces 121 with S/D epitaxial structures 110. In some embodiments, interfaces 121 can be coplanar with interfaces 123 formed between STI regions 106 and, substrate 102. In some embodiments, interfaces 121 can be below the level of interfaces 121. In some embodiments, interfaces 121 can be above the level of interfaces 123 as shown in FIGS. 1, 3, and 4. Bottom surfaces of these partially recessed portions of fin structures 104 may form interfaces (not shown) with substrate 102 and these interfaces may be either above or below the level of interfaces 123.

S/D epitaxial structures 110 can be formed on the partially recessed portions of fin structures 104 and disposed on opposing sides of gate structures 108, as shown in FIGS. 1 and 2. S/D epitaxial structures 110 can be configured to function as source/drain (S/D) regions of semiconductor device 100 and can include an epitaxially-grown semiconductor material. In some embodiments, the epitaxially-grown semiconductor material can include the same material as the material of substrate 102. In some embodiments, the epitaxially-grown semiconductor material can include a different material from the material of substrate 102 and imparts a strain on the channel regions underlying gate structures 108. Since the lattice constant of such epitaxially-grown semiconductor material is different from the material of substrate 102, the channel regions are strained to advantageously increase carrier mobility in the channel regions of semiconductor device 100. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, S/D epitaxial structures 110 can be grown by (i) chemical vapor deposition (CVD), such as low pressure CVD (LPCVD), atomic layer CVD (ALCVD), ultrahigh vacuum CVD (UHVCVD), reduced pressure CVD (RPCVD), and any suitable CVD; (ii) molecular beam epitaxy (MBE) processes; (iii) any suitable epitaxial process; or (iv) combination thereof in some embodiments, S/D epitaxial structures 110 can be grown by an epitaxial deposition/partial etch process, which repeats the epitaxial deposition/partial etch process at least once. Such repeated deposition/partial etch process can be referred to as a cyclic deposition-etch (CDE) process. In some embodiments, one or more flushes of etching gases can clean the wafer and the epitaxial growth chamber during the epitaxial growth of S/D epitaxial structures 110 to reduce residual gases and thereby reduce epitaxial defects. In some embodiments, as shown in FIG. 2, S/D epitaxial structures 110 can have, a minimum distance (e.g., proximity 110p) along an X-axis from an edge of S/D epitaxial structures 110 to an adjacent edge of gate structures 108. Proximity 110p can range from about 1 nm to about 10 nm. In some embodiments, as shown in FIG. 2, S/D epitaxial structures 110 can have a depth 110d along a Z-axis from bottom surfaces of S/D epitaxial structures 110 to top surfaces of fin structures 104. Depth 110d can range from about 20 nm to about 80 nm.

Each of S/D epitaxial structures 110 can be p-type or n-type. In some embodiments, semiconductor device 100 can include n-type FETs having n-type S/D epitaxial structures 110a, as shown in FIG. 3. In some embodiments, n-type S/D epitaxial structures 110a can include Si and can be in-situ doped during art epitaxial growth process using n-type dopants, such as phosphorus (P) and arsenic (As). For n-type in-situ doping, n-type doping precursors, such as phosphine ($PH_3$), arsine ($AsH_3$), and other n-type doping precursors, can be used.

Each of n-type epitaxial structures 110a can include epitaxially-grown n-type first epitaxial layers 111a, second epitaxial layers 112a, third epitaxial layers 113a, and fourth epitaxial layers 114a as shown in FIG. 3. First epitaxial layers 111a can be grown on the partially recessed portions of fin structures 104, second epitaxial lavers 112a can be grown on first epitaxial layers 111a, third epitaxial layers 113a can be grown on second epitaxial layers 112a, and fourth epitaxial layers 114a can be grown on third epitaxial layers 113a. In some embodiments, as shown in FIG. 3, first epitaxial layers 111a can be separately grown on adjacent fin structures 104 and second epitaxial layers 112a can grow on first epitaxial layers 111a and merge at a merging point 112ma. Merging point 112ma can be located at an intersection of where second epitaxial layers 112a start to merge during their growth on adjacent fin structures. Though FIGS. 1-4 show four epitaxial layers for S/D epitaxial structures 110, S/D epitaxial structures 110 can have one or more epitaxial layers and each epitaxial layer can have different compositions.

In some embodiments, each of n-type epitaxial layers 111a-114a can include Si and differ from each other based on, for example, doping concentration and/or epitaxial growth process conditions. For example, first epitaxial layers 111a can be undoped or can have a dopant concentration lower than the dopant concentrations of second, third, and fourth epitaxial layers 112a-114a, in some embodiments, first epitaxial layers 111a can have a dopant concentration less than about $5 \times 10^{20}$ atoms/$cm^3$, while second and third epitaxial layers 112a-113a can have a dopant concentration in a range from about $2 \times 10^{21}$ to about $5 \times 10^{21}$ atoms/$cm^3$ and fourth epitaxial layers 114a can have a dopant concentration in a range from about $5 \times 10^{20}$ to about $3 \times 10^{21}$ atoms/$cm^3$.

In some embodiments, first epitaxial layers 111a can include phosphorus-doped silicon (SiP) or arsenic-doped silicon (SiAs) and have a thickness L1a along a Z-axis direction ranging from about from about 3 nm to about 10 nm. Second epitaxial layers 112a can include SiP and have a thickness L2a along a Z-axis direction ranging from about 10 nm to about 40 nm. Second epitaxial layers 112a can have a width S2a along a Y-axis ranging from about 30 nm to about 90 nm. Third epitaxial layers 113a can include SiP and have a thickness L3a along a Z-axis direction ranging from about from about 5 nm to about 20 nm. Fourth epitaxial layers 114a can include SiP and have a thickness L4a along a Z-axis direction ranging from about 3 nm to about 10 nm. N-type S/D epitaxial structures 110a can have a width S1a along a Y-axis ranging from about 30 nm to about 80 nm. In some embodiments, a ratio of width S1a to distance S3 can range from about 1.5 to about 4. If width S1a is less than about 30 nm, or the ratio is less than about 1.5, resistances of n-type S/D epitaxial structures 110a can increase. If width S1a is greater than about 100 nm, or the ratio is greater than about 4, n-type epitaxial structures 110a may short to adjacent structures.

In some embodiments, n-type S/D epitaxial structures 110a can have a height a along a Z-axis from top surfaces of STI regions 106 to top surfaces of n-type S/D epitaxial structures 110a ranging from about 40 nm to about 100 nm. N-type epitaxial structures 110a can have a height H2a along a Z-axis from top surfaces of STI regions 106 to merging point 112ma ranging from about 20 nm to about 50 nm. A ratio of height H2a to height H1 as can range from about 0.4 to about 0.5. If H1a is less than about 40 nm, H2a is greater than about 50 nm, or the ratio is greater than about 0.5, a volume of n-type epitaxial structures 110a may decrease and the resistance of n-type S/D epitaxial structures 110a may increase. If H1a is greater than about 100 nm, H2a is less than about 20 nm, or the ratio is less than about 0.4, n-type S/D epitaxial structures 110a may have unwanted growth defects that may short to adjacent structures. In some embodiments, as shown in FIG. 3, n-type SSD epitaxial structures 110a can have a height H3a along a Z-axis from top surfaces of fin structures 104 (e.g., dotted box in FIG. 3) to top surfaces of n-type epitaxial structures 110a ranging from about 2 nm to about 10 nm. If height H3a is less than about 2 nm, a volume of n-type S/D epitaxial structures 110a may decrease and the resistance of n-type S/D epitaxial structures 110a may increase. If height H3a is greater than about 10 nm, n-type epitaxial structures 110a may have unwanted growth along a Y-axis direction and short to adjacent structures.

In some embodiments, semiconductor device 100 can include p-type FETs having p-type S/D epitaxial structures 110b, as shown in FIG. 4. In some embodiments, p-type epitaxial structures 110 can include SiGe, Si, silicon germanium bromide (SiGeB), Ge or III-V materials (e.g., indium antimonide (InSb), gallium antimonide (GaSb), or indium gallium antimonide (InGaSb)) and can be in-situ doped during an epitaxial growth process using p-type dopants, such as boron, indium, and gallium. For p-type in-situ doping, p-type doping precursors, such as diborane ($B_2H_6$), boron trifluoride ($BF_3$), and/or other p-type doping precursors, can be used.

Each of p-type epitaxial structures 110b can include epitaxially-grown p-type first epitaxial layers 111b, second epitaxial layers 112b, third epitaxial layers 113b, and fourth epitaxial layers 114b, as shown in FIG. 4. First epitaxial layers 111b can be grown on the partially recessed portions of fin structures 104, second epitaxial layers 112b can be grown on first epitaxial layers 111b, third epitaxial layers 113b can be grown on second epitaxial layers 112b, and fourth epitaxial layers 114b can be grown on third epitaxial layers 113b. In some embodiments, as shown in FIG. 4, first epitaxial layers 111b can be separately grown on adjacent fin structures 104 and second epitaxial layers 112b can grow on first epitaxial layers 111b and merge at a merging point 112mb.

In some embodiments, each of p-type epitaxial layers 111b-114b can include SiGe and differ from each other based on, for example, doping concentration, epitaxial growth process conditions, and/or relative concentration of Ge with respect to Si. For example, the Ge atomic percent in first epitaxial layers 111b can be less than the Ge atomic percent in second and third epitaxial layers 112b-113b but greater than the Ge atomic percent in fourth epitaxial layers 114b. In some embodiments, the Ge atomic percent in first, second, and third epitaxial layers 111b-113b can be similar, but greater than the Ge atomic percent in fourth epitaxial layers 114b. In some embodiments, first epitaxial layers 111b can include Ge in a range from about 15 atomic percent to about 35 atomic percent, while second and third epitaxial layers 112b-113b can have similar Ge atomic percent in a range from about 35 atomic percent to about 70 atomic percent and fourth epitaxial layers 114b can include less than about 45 atomic percent Ge, with any remaining atomic percent being Si in each of epitaxial layers 111b-114b.

The epitaxial layers can have varying dopant concentration with respect to each other. For example, first epitaxial layers 111b can be undoped or can have a dopant concentration lower than the dopant concentrations of second, third, and fourth epitaxial layers 112b-114b. In some embodiments, first epitaxial layers 111b can have a dopant concentration less than about $5 \times 10^{20}$ atoms/cm$^3$, while second and third epitaxial layers 112b-113b can have a dopant concentration in a range from about $1 \times 10^{20}$ to about $2 \times 10^{21}$ atoms/cm$^3$ and fourth epitaxial layers 114b can have a dopant concentration in a range from about $5 \times 10^{20}$ to about $2 \times 10^{21}$ atoms/cm$^3$.

In some embodiments, first epitaxial layers 111b can include SiGe or SiGeB and have a thickness L1b along a Z-axis direction ranging from about from about 3 nm to about 10 nm. Second epitaxial layers 112b can include SiGeB and have a thickness L2b along a Z-axis direction ranging from about 10 nm to about 40 nm. Second epitaxial layers 112b can have a width S2b along a Y-axis ranging from about 30 nm to about 90 nm. Third epitaxial layers 113b can include SiGeB and have a thickness L3b along a Z-axis direction ranging from about from about 5 nm to about 20 nm. Fourth epitaxial layers 114b can include SiGeB and have a thickness L4b along a Z-axis direction ranging from about 3 nm to about 10 nm. P-type S/D epitaxial structures 110b can have a width Sib along a Y-axis ranging from about 40 nm to about 100 nm. In some embodiments, as n-type S/D epitaxial structures 110a can have more active dopants than p-type epitaxial structures 110b, width S1b can be larger than width S1a to achieve similar active dopants and thus similar resistance for n-type and p-type SSD epitaxial structures 110a and 110B. In some embodiments, a ratio of width S1b to distance S3 can range from about 2 to about 4. If width S1b is less than about 40 nm, or the ratio is less than about 2, resistances of p-type S/D epitaxial structures 110b can increase. If width S1b is greater than about 100 nm, or the ratio is greater than about 4, p-type S/D epitaxial structures 110b may be short to adjacent structures.

In some embodiments, p-type. SSD epitaxial structures 110b can have a height H1b along a Z-axis from top surfaces of STI regions 106 to top surfaces of p-type SSD epitaxial structures 110b ranging from about 40 nm to about 100 nm, P-type epitaxial structures 110b can have a height H2b along a Z-axis from top surfaces of STI regions 106 to merging point 112mb ranging from about 10 nm to about 30 nm. A ratio of height H2b to height H1b can range from about 0.2 to about 0.3, If H1b is less than about 40 nm, H2b is greater than about 30 urn, or the ratio is greater than about 0.3, a volume of p-type S/D epitaxial structures 110b may decrease and the resistance of p-type S/D epitaxial structures 110b may increase. If H1b is greater than about 100 nm, H2b is less than about 10 nm, or the ratio is less than about 0.2, p-type S/D epitaxial structures 110b may have unwanted growth defects that may short to adjacent structures.

In some embodiments, as shown in FIG. 4, p-type S/D epitaxial structures 110b can have a height H3b along a Z-axis from top surfaces of fin structures 104 (e.g., dotted box in FIG. 4) to top surfaces of p-type epitaxial structures 110b ranging from about 3 nm to about 15 nm. If height H3b is less than about 3 nm, a volume of p-type S/D epitaxial structures 110b may decrease and the resistance of p-type S/D epitaxial structures 110b may increase. If height H3b is greater than about 15 nm, p-type epitaxial structures 110b may have unwanted growth along a Y-axis direct and short to adjacent structures. A difference between height H3b and H3a can range from about 1 nm to about 5 nm. During the formation of S/D contact structures, n-type and p-type S/D epitaxial structures 110a-110b can be etched in a same etching process. In some embodiments, p-type S/D epitaxial structures 110b can have a higher etching rate than n-type SSD epitaxial structures 110a. With a greater height H3b, S/D contact structures can land on n-type and p-type S/D epitaxial structures 110a-110b at a same level above top surfaces of substrate 102. If the difference is less than about 1 nm or greater than about 5 nm, S/D contact structures may not land on n-type and p-type S/D epitaxial structures 110a-110b at a same level above top surfaces of substrate 102.

According to some embodiments, first epitaxial layers 111a and 111b can serve as buffers between fin structures 104 and second epitaxial layers 112a and 112b, respectively, to reduce leakage current during an off-state of FETs in semiconductor device 100. Second and third epitaxial layers 112a-113a and 112b-113b can have higher dopant concentration to reduce resistance of S/D epitaxial structures 110a and 110b. Fourth epitaxial layers 114a and 114b can serve as capping layers for third epitaxial layers 113a and 113b.

Gate structures 108 can include a gate dielectric layer 116 and a gate electrode 118 disposed on gate dielectric layer 116. Gate structures 108 can be formed by a gate replacement process. In some embodiments, gate dielectric layer 116 can include silicon oxide and can be formed by CVD, atomic layer deposition (ALD), physical vapor deposition (PVD), or other suitable processes. In some embodiments, gate dielectric layer 116 can include (i) a layer of silicon oxide, silicon nitride, and/or silicon oxynitride, (ii) a high-k dielectric material, such as hafnium oxide ($HfO_2$), titanium oxide ($TiO_2$), and zirconium oxide ($ZrO_2$), (iii) a high-k dielectric material having oxides of lithium (Li), zirconium (Zr), aluminum (Al), lanthanum (La), or lutetium (Lu), or (iv) a combination thereof. High-k dielectric layers can be formed by ALD and/or other suitable methods. In some embodiments, gate dielectric layer 116 can include a single layer or a stack of insulating material layers.

In some embodiments, gate electrode 118 can include a gate barrier layer (not shown), a gate work function layer 122, and a gate metal fill layer 124. The gate barrier layer can serve as a nucleation layer for subsequent formation of gate work function layer 122 and/or can help prevent substantial diffusion of metals (e.g., Al) from gate work function layer 122 to underlying layers (e.g., gate dielectric layer 116). Gate work function layer 122 can include a single metal layer or a stack of metal layers. The stack of metal layers can include metals having work function values equal to or different from each other. Gate metal fill layer 124 can include a single metal layer or a stack of metal layers. The stack of metal layers can include metals different from each other. In some embodiments, gate metal fill layer 124 can include a suitable conductive material, such as titanium (Ti), silver (Ag), Al, metal alloys, and combinations thereof.

Each of spacers 120 can include spacer portions 120a that form sidewalls of gate structures 108 and are in contact with dielectric layer 116, spacer portions 120b that form sidewalk of fin structures 104, and spacer portions 120c that form protective layers on STI regions 106. Spacers 120 can include insulating material, such as silicon oxide, silicon nitride, a low-k material, and a combination thereof. Spacers 120 can have a low-k material with a dielectric constant less than about 3.9 (e.g., less than about 2.8, about 3, or about 3.5). In some embodiments, spacers 120 can have a thickness in a range from about 5 nm to about 10 nm. In some embodiments, spacers 420 can include a stack of layers, such as spacers 120b-1 and spacers 120b-2 for 120b, as shown in FIGS. 3 and 4. In some embodiments, spacers 120b-1 and spacers 120b-2 can include different insulating, materials. For example, spacers 120b-1 can include silicon nitride, and spacers 120b-2 can include a low-k material, such as silicon carbon oxynitride (SiCON). Referring to FIGS. 3 and 4, in some embodiments, semiconductor device 100 can further include a dielectric layer 330. Dielectric layer 330 can include an oxide material (e.g., silicon oxide) and protect spacers 120.

STI regions 106 can provide electrical isolation to fin structures 104 from adjacent fin structures and to semiconductor device 100 from neighboring structures integrated with or deposited onto substrate 102. STI regions 106 can have a dielectric material, such as silicon oxide, silicon nitride, silicon oxynitride, fluorine-doped silicate glass (FSG), a low-k dielectric material, and/or other suitable insulating materials. In some embodiments, STI regions 106 can include a multi-layered structure.

Interlayer dielectric (ILD) layer can be disposed on spacers 120 and can isolate S/D epitaxial structures 110 from each other and from other structures. The ILD layer is not shown in FIG. 1 for the sake of clarity. The ILD layer can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can be silicon oxide. In some embodiments, the ELD layer can have a thickness along a Z-axis in a range from about 3 nm to about 200 nm. In some embodiments, the IUD layer can include a stack of dielectric layers.

Figure 5:
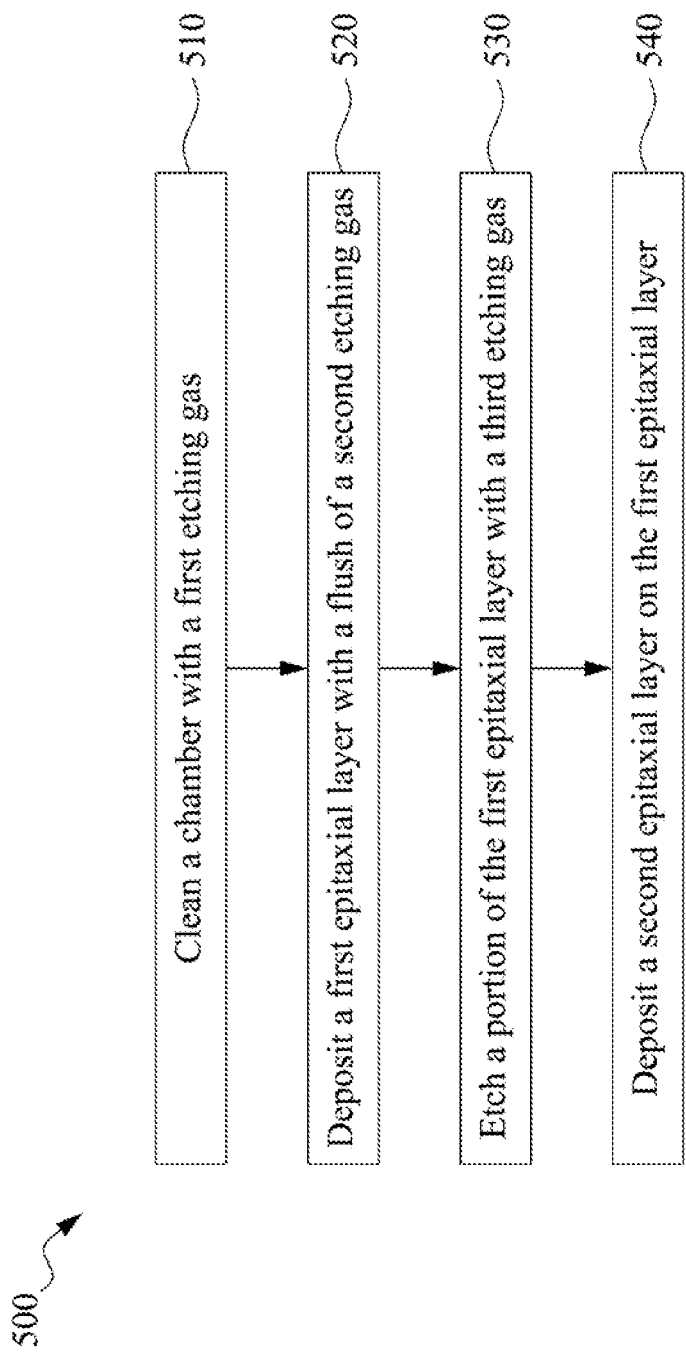
FIG. 5 is a flow diagram of a method for fabricating S/D epitaxial structures on a semiconductor device with optimized cleaning processes, in accordance with some embodiments.

FIG. 5 is a flow diagram of a method 500 for fabricating S/D epitaxial structures on a semiconductor device with optimized cleaning processes, in accordance with some embodiments. Method 500 may not be limited to finFET devices and can be applicable to devices that would benefit from the uniform S/D epitaxial structures formed with optimized cleaning processes, such as planar FETs, finFETs, GAA FETs, etc. Additional fabrication operations may be performed between various operations of method 500 and may be omitted merely for clarity and ease of description, Additional processes can be provided before, during, and/or after method 500; one or more of these additional processes are briefly described herein. Moreover, not all operations may be needed to perform the disclosure provided herein.

Additionally, some of the operations may be performed simultaneously or in a different order than shown in FIG. 5. In some embodiments, one or more other operations may be performed in addition to or in place of the presently described operations.

Figure 6:
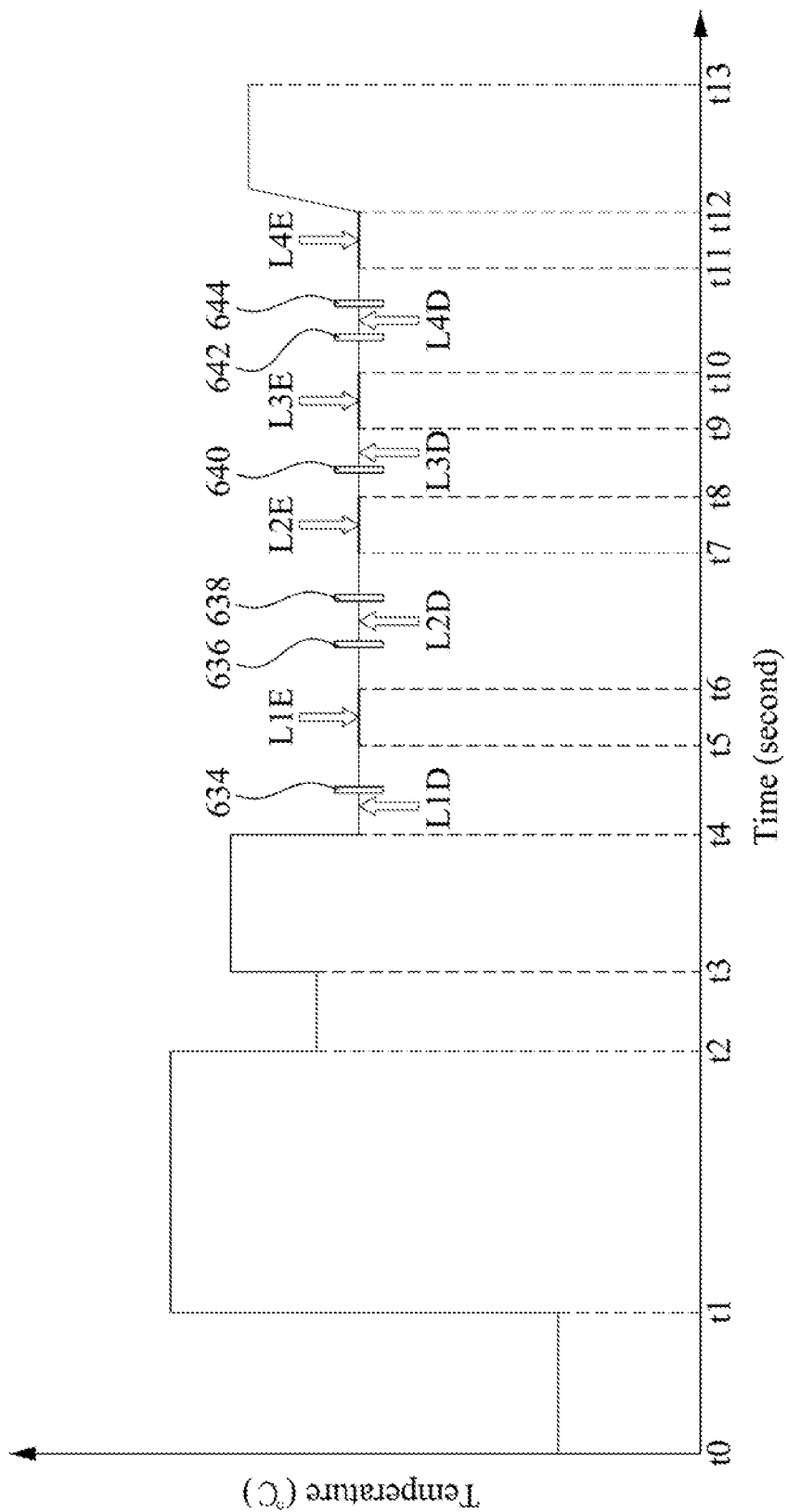
FIG. 6 illustrates process temperatures versus process times during fabricating S/D epitaxial structures on a semiconductor device with optimized cleaning processes, in accordance with some embodiments.

For illustrative purposes, the operations illustrated in FIG. 5 will be described with reference to the example. Fabrication process for fabricating semiconductor device 100 as illustrated in FIGS. 6-14. FIG. 6 illustrates process temperatures versus process times during fabricating S/D epitaxial structures on semiconductor device 100 with optimized cleaning processes, in accordance with some embodiments. FIGS. 7-14 illustrate cross-sectional views of semiconductor device 100 having epitaxial structures 110 formed with optimized cleaning processes at various stages of its fabrication, in accordance with some embodiments. Although FIGS. 7-14 illustrate fabrication processes of merged S/D epitaxial structures 110 on two adjacent fin structures 104 with optimized cleaning processes, method 500 can be used to form separate S/D epitaxial structures 110 on individual fin structures 104 with optimized cleaning processes. Elements in FIGS. 7-14 with the same annotations as elements in FIGS. 1-4 are described above.

Figure 7:
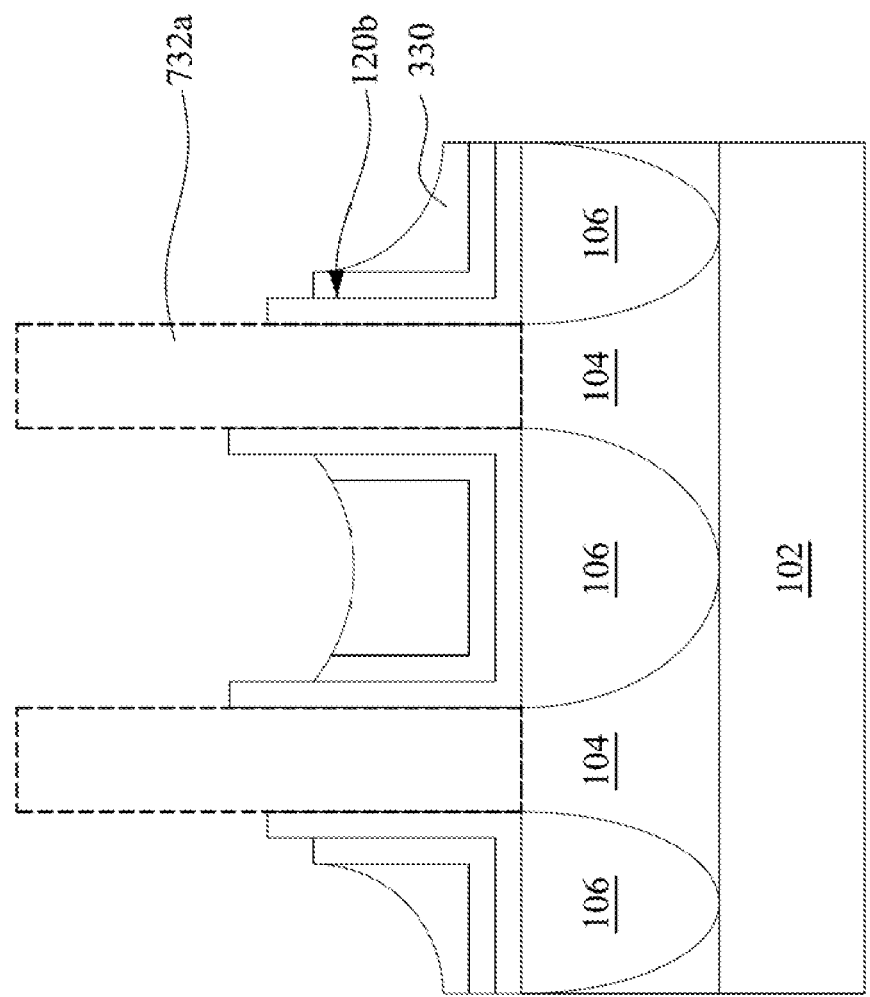
FIGS. 7-14 illustrate cross-sectional views of a semiconductor device having S/D epitaxial structures formed with optimized cleaning processes at various stages of its fabrication, in accordance with some embodiments.
Figure 8:
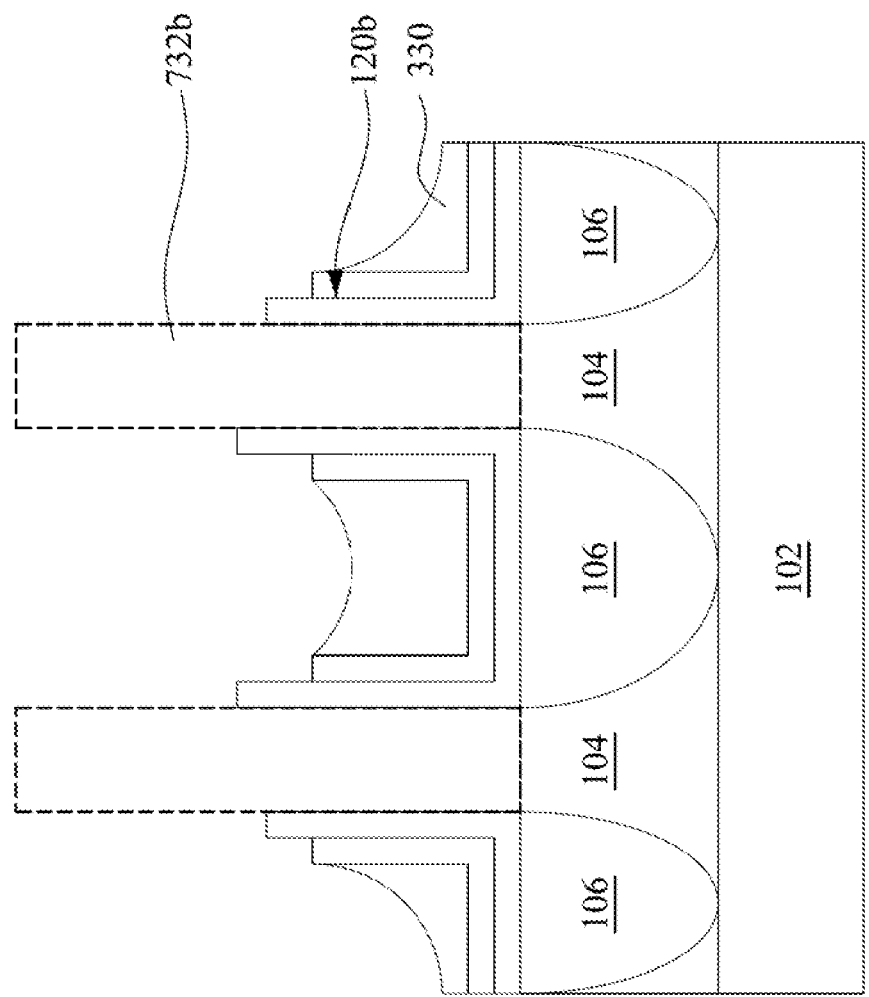

In referring to FIG. 5, method 500 begins with operation 510 and the process of cleaning a chamber with a first etching gas. For example, as shown in FIG. 6, an epitaxial growth chamber can be cleaned with a first etching gas from time t1 to time t2 (e.g., from about 150 s to about 450 s), in which the duration between times t1 and t2 can be about 280 s to about 320 s, at an elevated temperature before introduction of a wafer. Prior to the cleaning of the epitaxial growth chamber, the wafer can be loaded to a pre-clean chamber, where top surfaces of the wafer can be pre-cleaned with a plasma of ammonia ($NH_3$) and/or nitrogen trifluoride ($NF_3$) from time t0 to time t1 (e.g., from about 0 s to about 150 s), in which the duration between times t0 and t1 can be about 130 s to about 170 s, at a temperature ranging from about 30° C. to about 200° C. as shown in FIG. 6. The wafer can include semiconductor device 100 with recessed fin structures 104 for n-type and p-type S/D epitaxial structure growth, as shown in FIGS. 7 and 8 respectively. Referring to FIGS. 7 and 8, fin structures 104 can be recessed to a level coplanar with top surfaces of STI regions 106. Regions 732a and 732b with dotted boxes can indicate removed portions of fin structures 104. In some embodiments, fin structures 104 can be recessed to a level below top surfaces of STI regions 106 or below top surfaces of substrate 102. The pre-cleaning process can remove residues from prior recess process of fin structure 104.

During or after pre-cleaning the wafer, the epitaxial growth chamber can be cleaned with the first etching gas prior to moving the wafer from the pre-clean chamber to the epitaxial growth chamber. In some embodiments, the first etching gas can include hydrogen chloride (HCl) and/or chlorine ($Cl_2$), or other suitable etching gases and hydrogen ($H_2$) as a carrier gas. The epitaxial growth chamber can be cleaned with the first etching gas at an elevated temperature ranging from about 1000° C. to about 1200° C. under a pressure ranging from about 10 Torr to about 750 Torr for about 2 min to about 7 min. If the temperature is lower than about 1000° C., residuals (e.g., metal contamination and Ge, As, P, and B residual coatings) in the epitaxial growth chamber may not be removed. If the temperature is higher than about 1200° C., the epitaxial growth chamber may be damaged. In some embodiments, the chamber cleaning process can include etching with the first etching gas without coating a protective layer (e.g. silicon layer) in the epitaxial growth chamber. The protective layer coated in the epitaxial growth chamber may retain residuals and introduce epitaxial defects during growth of SSD epitaxial structures. Compared to a chamber cleaning process at a lower temperature with protective layer coating, the chamber cleaning process at the elevated temperature of about 1000° C. to about 1200° C. without protective layer coating can improve uniformity of SSD epitaxial structures and thereby increase process yield. In some embodiments, a variation of the width (e.g., a difference between a maximum width and a minimum width) of S/D epitaxial structures 110 on the wafer can be reduced to about 2 mm to about 10 nm. A ratio of the variation to the width of S/D epitaxial structures can range from about 5% to about 30%. In some embodiments, the reduction of epitaxial structure defects and improvement of epitaxial structure profile uniformity can increase the process yield by about 5% to about 20%.

After cleaning the epitaxial growth chamber with the first etching gas, the wafer can be moved from the pre-clean chamber to the epitaxial growth chamber. As shown in FIG. 6, the wafer can be moved to the epitaxial growth chamber at time t2 followed by coating a semiconductor seed layer on the wafer from time t2 to time t3 (e.g., from about 450 s to about 500 s), in which the duration between times t2 and t3 can be about 30 s to about 70 s. In some embodiments, the semiconductor seed layer can include silicon with no doping and can be deposited by CVD or other suitable methods. The semiconductor seed layer can be deposited at a temperature from about 700° C. to about 800° C. under a pressure ranging from about 10 Torr to about 50 Torr. The semiconductor seed layer can reduce or eliminate defects, such as misfit dislocation defects formed during the recess process of fin structures 104 and prepare for epitaxial growth of S/D epitaxial structures 110. In some embodiments, the semiconductor seed layer can have a thickness ranging from about 1 nm to about 3 nm.

The coating of the semiconductor seed layer on the wafer can be followed by baking the wafer in a hydrogen environment. As shown in FIG. 6, the wafer coated with the semiconductor seed layer can be baked from time t3 to time t4 (e.g., from about 500 s to about 600 s) at an elevated temperature ranging from about 800° C. to about 850° C. in which the duration between times t3 and t4 can be about 80 s to about 120 s. The wafer can be baked in a hydrogen environment under a pressure ranging from about 300 Torr to about 600 Torr. The baking process can remove residual gases (e.g., moisture, residual gases containing fluorine and/or carbon) from recessed fin structures 104. The residual gases can diffuse through the semiconductor seed layer during the baking process. If the temperature is lower than about 800° C., the baking process may not remove the residual gases and epitaxial defects (e.g., missing epitaxial structures) may increase. If the temperature is higher than about 850° C., the baking process may damage semiconductor device 100 on the wafer. In some embodiments, baking the wafer in a hydrogen environment can remove native oxide on recessed fin structures 104. In some embodiments, with pre-cleaning the wafer and the baking process, proximity 110p (shown in FIG. 2) can be reduced and depth 110d (shown in FIG. 2) can be increased, which can mitigate SCEs and improve device performance.

Figure 9:
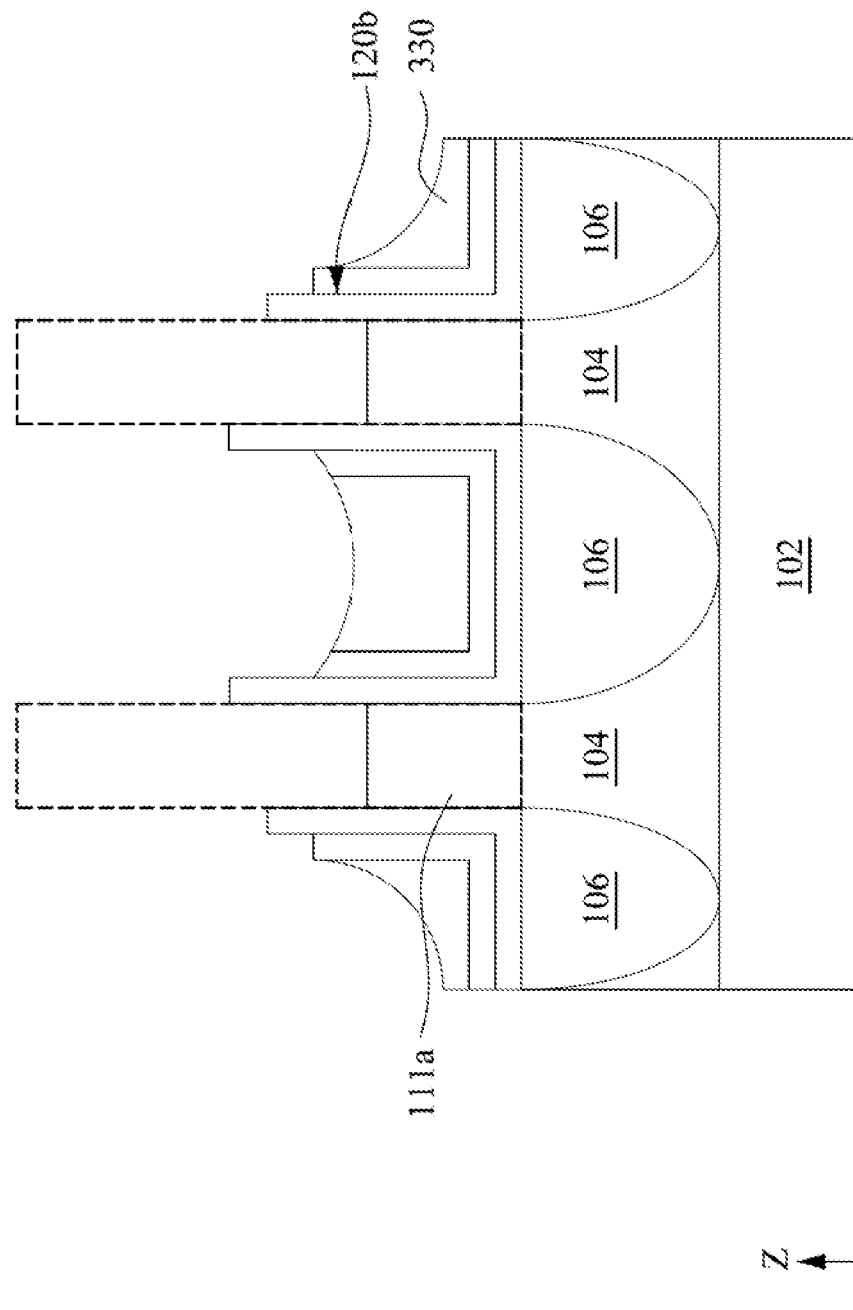
Figure 10:
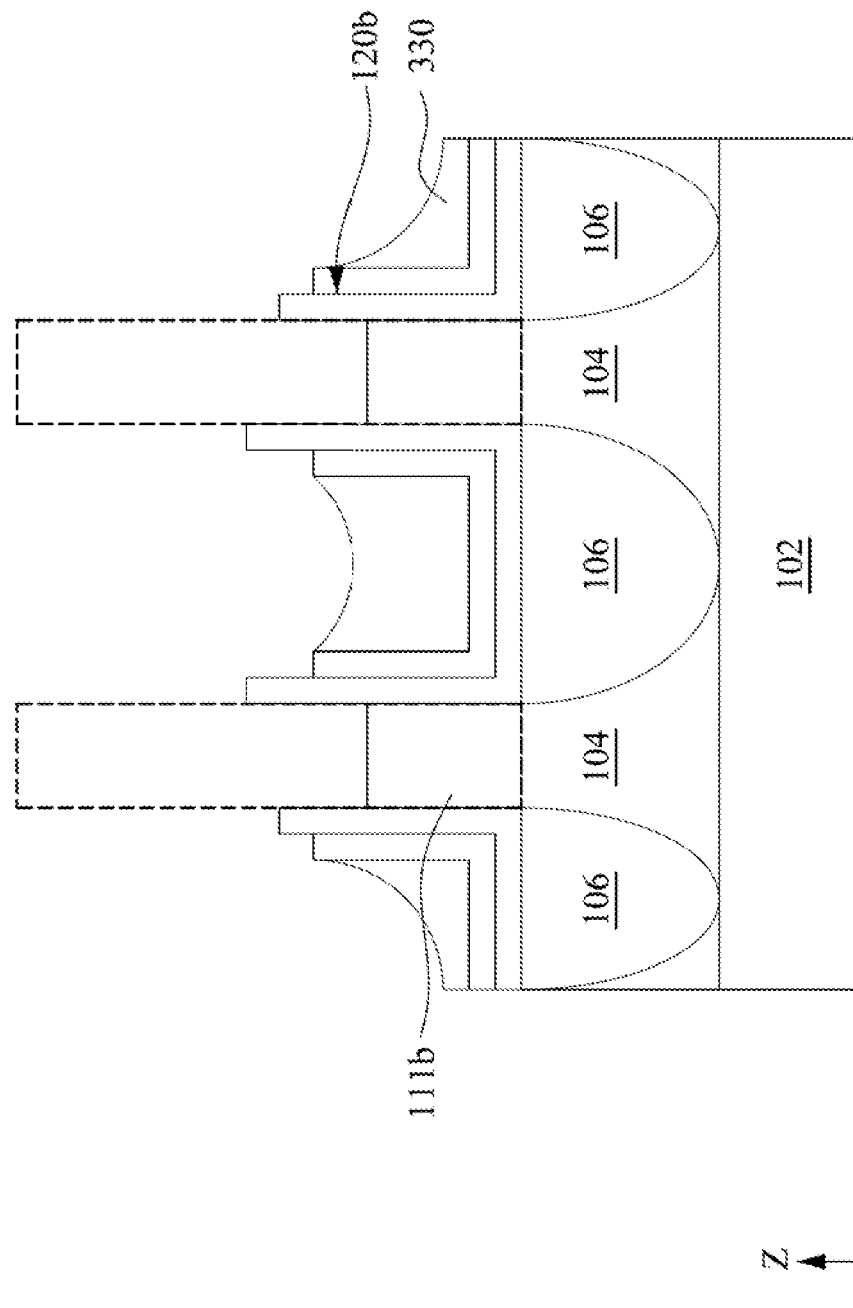

Referring to FIG. 5, in operation 520, a first epitaxial layer can be deposited on the wafer with a flush of a second etching gas. For example, as shown in FIGS. 6, 9, and 10, first epitaxial layers 111a-111b can be deposited in a deposition process L1D on recessed portions of fin structures 104 on the wafer. In some embodiments, first epitaxial layers 111a-111b can be deposited on the semiconductor seed layer and have a different composition (e.g., doped with n-type or p-type dopants) from the semiconductor seed layer. The deposition process LID can include: (i) epitaxially growing a first portion of first epitaxial layer 111a or 111b, (ii) cleaning the wafer and the epitaxial growth chamber with a flush of a second etching gas, and (iii) epitaxially growing a second portion of first epitaxial layer 111a or 111b. The deposition process will be mainly described with reference to first epitaxial layers 111a for ease of description, while the deposition process also applies to first epitaxial layers 111b.

As shown in FIGS. 6 and 9, after baking the wafer in a hydrogen environment, first epitaxial layers 111a can be deposited on recessed portions of fin structures 104 from time t4 to time t5 from about 600 s to about 700 s), in which the duration between times t4 and t5 can be about 80 s to about 120 s. In some embodiments, n-type first epitaxial layers 111a can be epitaxially grown at a temperature from about 650° C. to about 750° C. under a pressure ranging from about 10 Torr to about 300 Torr. The epitaxial growth process of n-type first epitaxial layers 111a can use precursors including dichlorosilane (DCS) and/or $SiH_4$ as a Si precursor, $PH_3$ or $AsH_3$ as an n-type dopant precursor, HCl, hydrogen ($H_2$), and nitrogen ($N_2$). In some embodiments, p-type first epitaxial layers 111b can be epitaxially grown at a temperature from about 600° C. to about 700° C. under a pressure ranging from about 10 Torr to about 50 Torr. The epitaxial growth process of p-type first epitaxial layers 111b can use precursors including $GeH_4$ as a Ge precursor, dichlorosilane (DCS) and/or $SiH_4$ as a Si precursor, $B_2H_6$ or $BF_3$ as a p-type dopant precursor, HCl, $H_2$, and $N_2$.

After epitaxially growing the first portion of first epitaxial layers 111a, the epitaxial growth precursors (e.g., Si and dopant precursors) can be stopped and a flush 634 of a second etching gas can clean the wafer surface and the chamber during time t4 and time t5, as shown in FIG. 6. In some embodiments, the second etching gas can include HCl and have a flow rate ranging from about 100 sccm to about 300 sccm. Flush 634 can start at a time about 20% to about 50% of epitaxial growth process L1D and can continue for a time of about 3 s to about 10 s. Flush 634 of the second etching gas during the epitaxial growth of first epitaxial layers 111a can remove residual gases (e.g., unstable precursor species, such as silanide ($SiH_3$), P-P dimer, and B precursors) in the chamber and the wafer, thereby reducing defect sources for unwanted epitaxial growth on surfaces of other structures (e.g., polysilicon structures and photoresist layers). As a result, selectivity loss can be mitigated (or avoided) and first epitaxial layers 111a can continue to grow on fin structures 104 and not on the other structures. In addition, the removal of the residual gases can improve uniformity of S/D epitaxial structures 110.

After flush 634 of the second etching gas, the epitaxial growth precursors can continue and a second portion of first epitaxial layers 111a can be epitaxially grown on the first portion. The second portion of first epitaxial layers 111a can have a same composition as the first portion. First epitaxial layers 111a can be formed after the epitaxial growth of the second portion.

Referring to FIG. 5, in operation 530, a portion of the first epitaxial layer can be etched with a third etching gas. For example, as shown in FIGS. 6 and 9, an etching process L1E from time t5 to time t6 (e.g., from about 700 s to about 750 s), in which the duration between times t5 and t0 can be about 30 s to about 70 s, can remove a portion of first epitaxial layers 111a and form first epitaxial layers 111a, as shown in in FIG. 9. In some embodiments, the third etching gas can include HCl at a flow rate ranging from about 1000 sccm to about 3000 sccm for a time of about 10 s to about 50 s. In some embodiments, the etching process L1E can remove epitaxial defects such as unwanted epitaxial growth on structures other than fin structures 104. In some embodiments, the etching process L1E can remove epitaxial layers along a <100> direction (e.g., top surfaces) more than along a <111> direction (e.g., side surfaces). As a result, S/D epitaxial structures 110 can selectively grow on side surfaces and can have flat top surfaces shown in FIGS. 1, 3, and 4.

Figure 11:
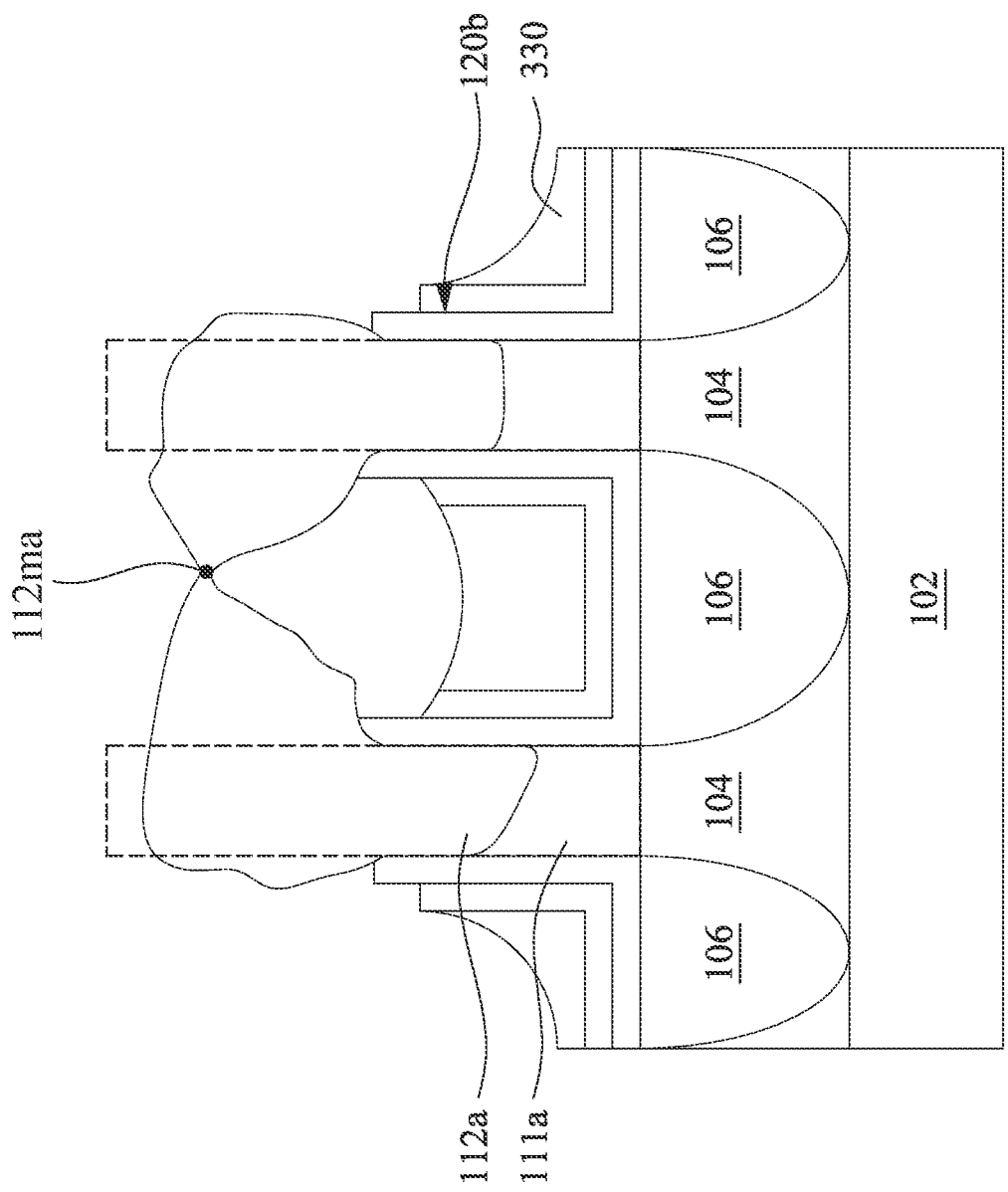
Figure 12:
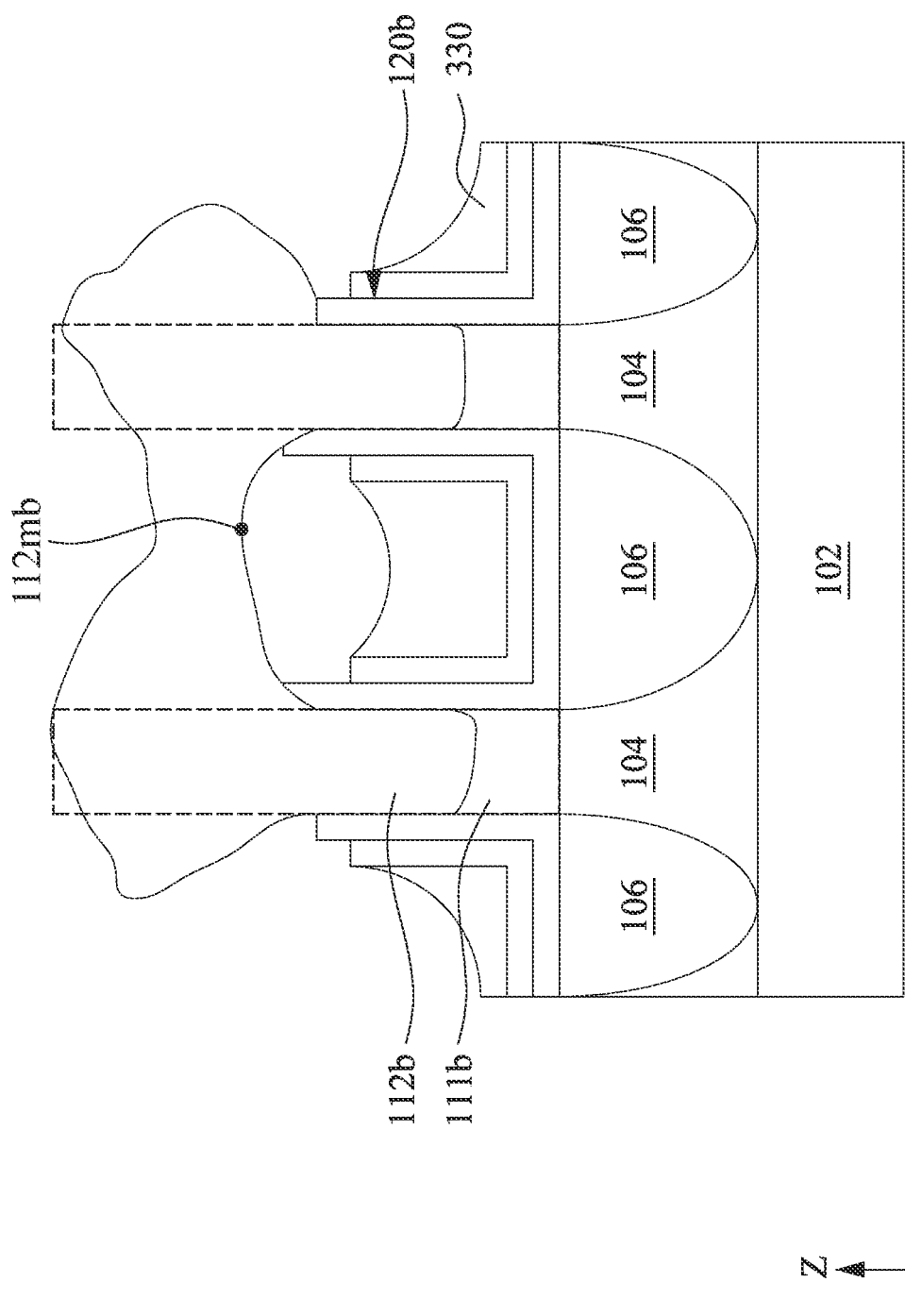

Referring to FIG. 5, in operation 540, a second epitaxial layer can be deposited on the first epitaxial layer. For example, as shown in FIGS. 6, 11, and 12, second epitaxial layers 112a-112b can be deposited on first epitaxial layers 111a-111b using a deposition process L2D from time t6 to time t7 (e.g., from about 750 s to about 900 s), in which the duration between times t6 and t7 can be about 130 s to about 170 s. In some embodiments, the deposition process L2D can be similar to the deposition process L1D of first epitaxial layers 111a-111b. In some embodiments, the deposition process L2D of second epitaxial layers 112a-112b can include two flushes 636 and 638 of the second etching gas due to a longer deposition time. In some embodiments, deposition process L2D can include any number of flushes with the second etching gas. The number of flushes can depend on the deposition time of the deposition process L2D. In some embodiments, the number of flushes in deposition process L2D can be greater than deposition process L1D. In some embodiments, an interval between flush 636 and flush 638 can range from about 30 s to about 50 s. If the interval is less than about 30 s, the time of the deposition process L2D may increase. If the interval is greater than about 50 s, the residual gases (e.g., unstable precursor species, such as silanide (SiH3), P-P dimer, and B precursors) may not be cleaned by the flushes.

After the deposition of second epitaxial layers 112a-112b, a portion of second epitaxial layers 112a-112b can be etched with a fourth etching gas in an etching process L2E from time t7 to time t8 (e.g., from about 900 s to about 1000 s), in which the duration between times t7 and t8 can be about 80 s to about 120 s, as shown in FIG. 6. The fourth etching gas can include HCl and SiH$_4$. In some embodiments, SiH$_4$ can slow the etching rate to provide a better control of profiles of second epitaxial layers 112a-112b and can maintain shapes (e.g., cone shape or wavy shape) of second epitaxial layers 112a-112b between fin structures 104. In some embodiments, the etching process L2E of second epitaxial layers 112a-112b can have substantially same flow rate and same etching time as the etching process L1E of first epitaxial layers 111a-111b. Similarly, the etching process L2E of second epitaxial layers 112a-112b can remove epitaxial defects and promote epitaxial growth on side surfaces. After the etching process L2E, as shown in FIGS. 11 and 12, second epitaxial layers 112a-112b can be formed on first epitaxial layers 111a-111b and merge at merging points 112ma and 112mb, respectively.

Figure 13:
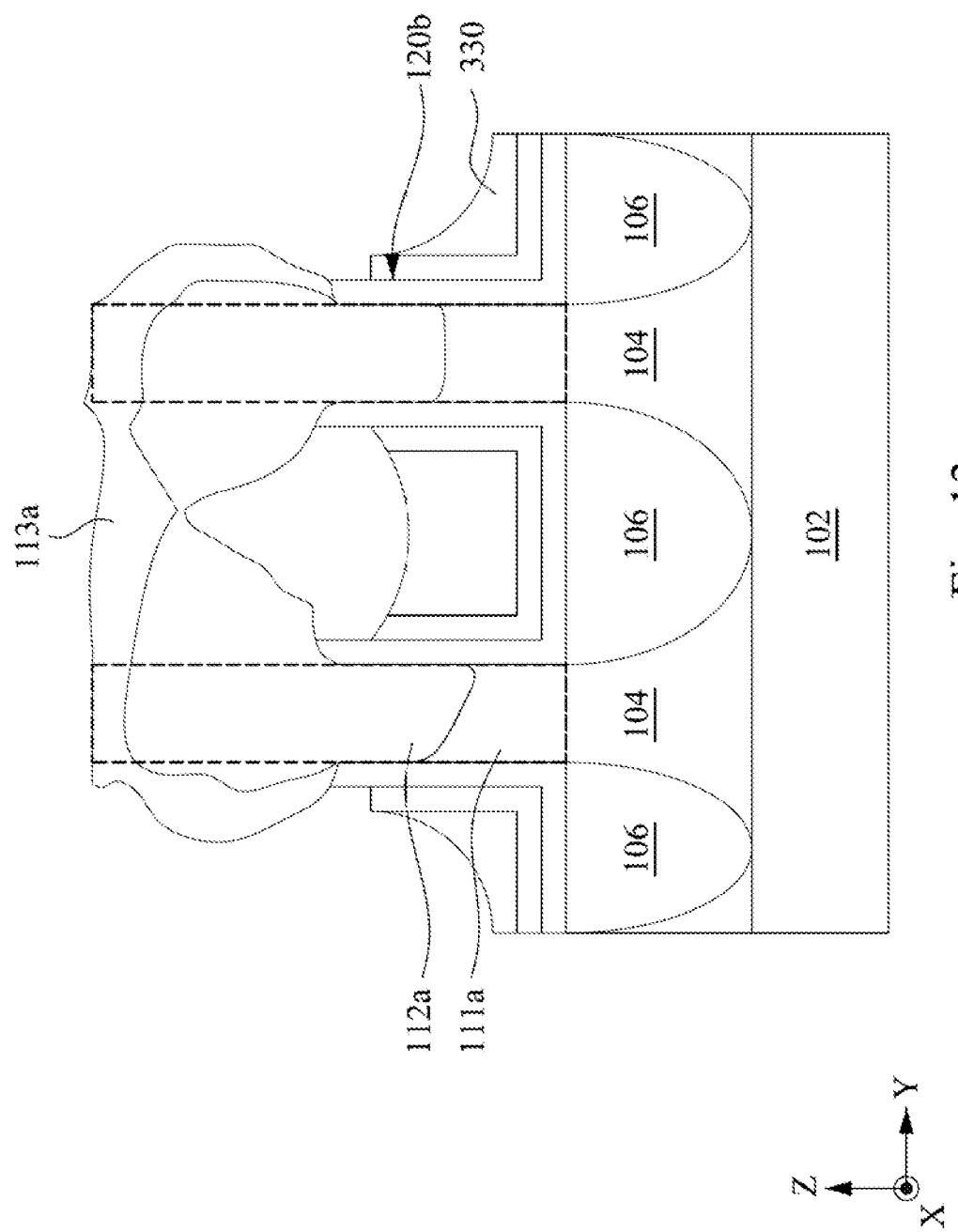
Figure 14:
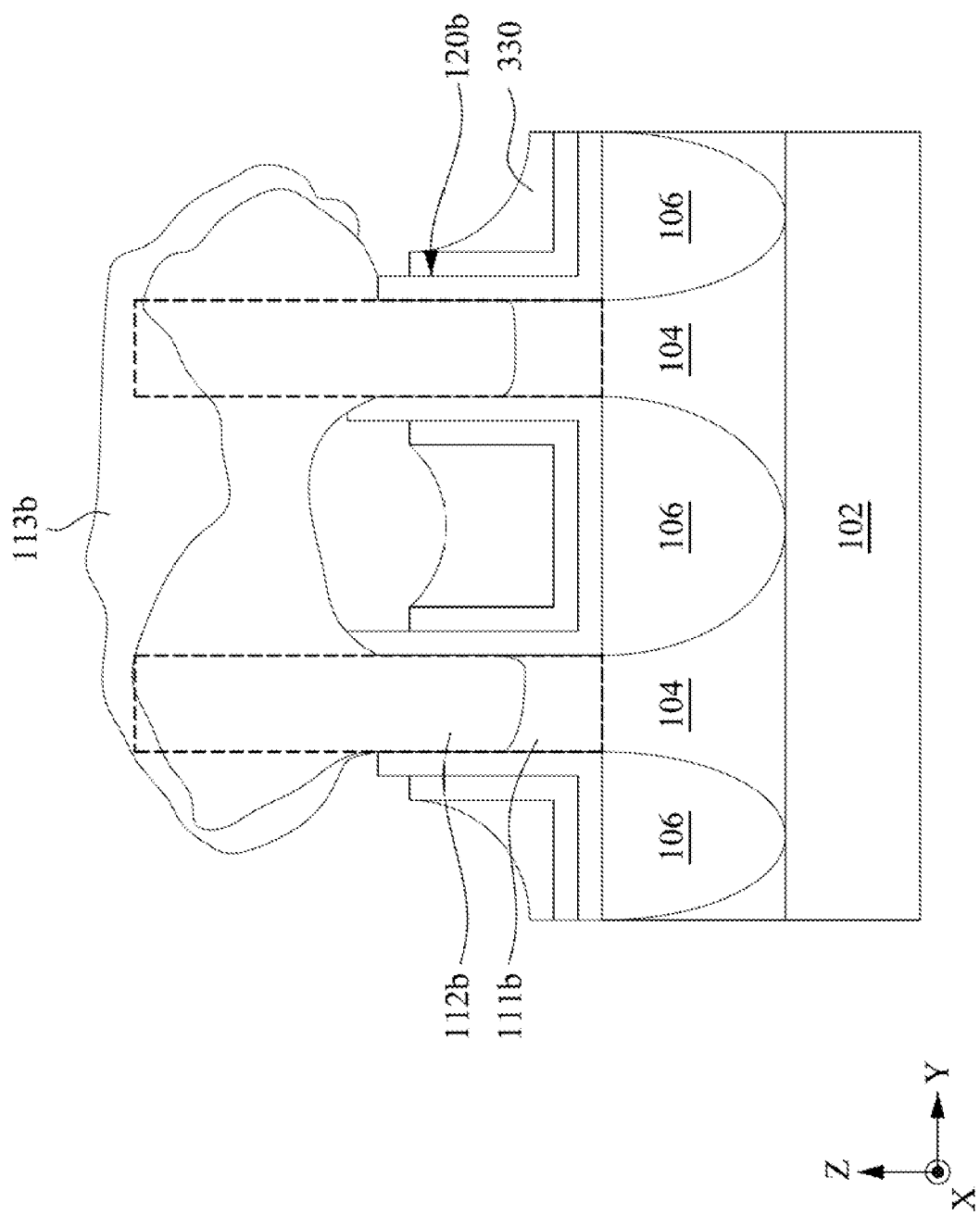

The formation of second epitaxial layers 112a-112b can be followed by the formation of third epitaxial layers 113a-113b on second epitaxial layers 112a-112b, respectively. Referring to FIG. 6, the formation of third epitaxial layers 113a-113b can include depositing third epitaxial layers 113a-113b on second epitaxial layers 112a-112b in a deposition process L3D from time t8 to time t9 (e.g., from about 1000 s to about 1100 s), in which the duration between times t8 and t9 can be about 80 s to about 120 s, and etching a portion of third epitaxial layers 113a-113b in an etching process L3E from time t9 to time t10 (e.g., from about 1100 s to about 1150 s), in which the duration between times t9 and t10 can be about 30 s to about 70 s. In some embodiments, the deposition process L3D of third epitaxial layers 113a-113b can be similar to the deposition process L2D of second epitaxial layers 112a-112b. The deposition process L3D of third epitaxial layers 113a-113b can include flush 640 of the second etching gas to clean residual gases (e.g., unstable precursor species, such as silanide (SiH3), P-P dimer, and B precursors) and reduce epitaxial defects. In some embodiments, the etching process L3E of third epitaxial layers 113a-113b can include the fourth etching gas and can be same as the etching process L2E of second epitaxial layers 112a-112b. After the etching process L3E, as shown in FIGS. 13 and 14, third epitaxial layers 113a-113b can be formed on second epitaxial layers 112a-112b, respectively.

The formation of third epitaxial layers 113a-113b can be followed by the formation of fourth epitaxial layers 114a-114b on third epitaxial layers 113a-113b, respectively. Referring, to FIG. 6, the formation of fourth epitaxial layers 114a-114b can include depositing fourth epitaxial layers 114a-114b on third epitaxial layers 113a-113b in a deposition process L4D from time t10 to time t11 (e.g., from about 1150 s to about 1300 s), in which the duration between times t10 and t11 can be about 130 s to about 170 s, and etching a portion of fourth epitaxial layers 114a-114b in an etching process L4E from time t11 to time t12 (e.g., from about 1300 s to about 1350 s), in which the duration between times t11 and t12 can, be about 30 s to about 70 s. In some embodiments, the deposition process L4D of fourth epitaxial layers 114a-114b can be similar to the deposition process L2D of second epitaxial layers 112a-112b. In some embodiments, the deposition process L4D of fourth epitaxial layers 114a-114b can include two flushes 642 and 644 of the second etching gas due to a longer deposition time. In some embodiments, the number of flushes in deposition process L4D can be greater than deposition process L1D. In some embodiments, an interval between flush 642 and flush 644 can range from about 30 s to about 50 s.

In some embodiments, a portion of fourth epitaxial layers 114a-114b can be etched with a fifth etching gas in an etching process L4E from time t11 to time t12 (e.g., from about 1300 s to about 1350 s), in which the duration between times t11 and t12 can be about 30 s to about 70 s, as shown in FIG. 6. The fourth etching gas can include HCl and GeH4. In some embodiments, GeH4 can increase the etching rate and remove epitaxial defects. In some embodiments, GeH4 can provide a better control of side shapes of S/D epitaxial structures 110a-110b. In some embodiments, the etching process L4E of fourth epitaxial layers 114a-114b can have substantially the same flow rate and same etching time as the etching process L2E of second epitaxial layers 112a-112b. Similarly, the etching process L4E of fourth epitaxial layers 114a-114b can remove epitaxial defects and promote epitaxial growth on side surfaces. After the etching process L4E, as shown in FIGS. 3 and 4, fourth epitaxial layers 114a-114b can be formed with flat top surfaces on third epitaxial layers 113a-113b, respectively. In some embodiments, the flat top surfaces can reduce contact resistances between S/D epitaxial structures and S/D contact structures.

After the formation of fourth epitaxial layers 114a-114b, a pumping process at an elevated temperature can further reduce epitaxial defects from time t12 to time t13 (e.g., from about 1350 s to about 1600 s), in which the duration between times t12 and t13 can be about 230 s to about 270 s. During the pumping process, the wafer with SR) epitaxial structures 110 can be heated at a temperature ranging from about 800° C. to about 850° C. In some embodiments, the pumping process can be performed in a hydrogen environment under a pressure ranging from about 10 Torr to about 50 Torr. In same embodiments, the pumping process at the elevated temperature can anneal S/D epitaxial structures in-situ.

After the pumping process, S/D epitaxial structures 110 can be formed on fin structures 104. With flushes 634, 636, 638, 640, 642, and 644 during deposition of epitaxial layers 111-114, residual gases (e.g., unstable precursor species, such as silanide ($SiH_3$), P-P dimmer, and B precursors) can be removed from the wafer and the epitaxial growth chamber and epitaxial defects (e.g., unwanted epitaxial growth) can be reduced. As a result, uniformity of S/D epitaxial structures 110 can be improved. In some embodiments, a variation of the width (e.g., a difference between a maximum width and a minimum width) of S/D epitaxial structures 110 on the wafer can be reduced to about 2 nm to about 10 nm. A ratio of the variation to the width of S/D epitaxial structures can range from about 5% to about 30%. In some embodiments, the reduction of epitaxial structure defects and improvement of epitaxial structure profile uniformity can increase the process yield by about 5% to about 20%. The formation of S/D epitaxial structures 110 can be followed by the formation of gate structures 108 and formation of S/D contact structures on S/D epitaxial structures 110, which are not described in detail for the sake of simplicity.

Various embodiments in the present disclosure provide example methods for forming uniform S/D epitaxial structures 110 with optimized cleaning processes on semiconductor device 100 on a wafer. The example methods in the present disclosure can clean an epitaxial growth chamber at an elevated temperature prior to the introduction of the wafer, baking the wafer and the epitaxial growth chamber in a hydrogen environment, and cleaning the wafer and the epitaxial growth chamber during the epitaxial growth the Si) epitaxial structures 110 with one or more flushes (e.g., flushes 634, 636, 638, 640, 642, and 644) of the second etching gases having a lower flow rate and a shorter time than the etching processes (e.g., etching processes L1E, L2E, L3E, and L4E). The temperature and etching time of the cleaning processes can be optimized to remove residual gases (e.g., unstable precursor species, such as silanide ($SiH_3$), P-P dimmer, and B precursors) in the epitaxial growth chamber and thereby reduce epitaxial defects. In some embodiments, after the formation of S/D epitaxial structures 110, a pumping process at an elevated temperature can further reduce epitaxial defects. As a result of reducing of epitaxial defects, such as missing epitaxial structures and unwanted growth of epitaxial structures, the dimension and profile variations of S/D epitaxial structures 110 on the wafer can be reduced and the profile uniformity of S/D epitaxial structures 110 on the wafer can be improved. In some embodiments, a variation of the width (e.g., a difference between a maximum width and a minimum width) of S/D epitaxial structures 110 on the wafer formed with optimized cleaning processes can be reduced to about 2 nm to about 10 nm. A ratio of the variation to the width of S/D epitaxial structures can range from about 5% to about 30%. In some embodiments, the reduction of epitaxial structure defects and improvement of epitaxial structure profile uniformity can increase the process yield by about 5% to about 20%.

In some embodiments, a method of forming an epitaxial layer on a substrate in a chamber includes cleaning the chamber with a first etching gas and depositing the epitaxial layer on the substrate. The depositing the epitaxial layer includes epitaxially growing a first portion of the epitaxial layer with a precursor, cleaning the substrate and the chamber with a flush of a second etching gas different from the first etching gas, and epitaxially growing a second portion of the epitaxial layer with the precursor. The first portion and the second portion have a same composition. The method furthers includes etching a portion of the epitaxial layer with a third etching gas having a flow rate higher than that of the second etching gas.

In some embodiments, a method includes depositing a first epitaxial layer on a substrate in a chamber. The depositing the first epitaxial layer includes epitaxially growing a first portion of the first epitaxial layer with a precursor, cleaning the substrate and the chamber with a first etching gas, and epitaxially growing a second portion of the first epitaxial layer with the precursor. The first portion and the second portion have a same composition. The method further includes etching a portion of the first epitaxial layer with a second etching gas and depositing a second epitaxial layer on the first epitaxial layer with a different composition from the first epitaxial layer. A flow rate of the second etching gas is higher than a flow rate of the first etching gas.

In some embodiments, a method includes forming a first fin structure and a second fin structure on a substrate, etching a portion of the first and second fin structures, and forming a source/drain (S/D) epitaxial structure on the etched first and second fin structures. The forming the S/D epitaxial structure includes epitaxially growing a first portion of a first epitaxial layer in a chamber with a precursor, cleaning the substrate and the chamber with a first etching gas, epitaxially growing a second portion of the first epitaxial layer with the precursor, and etching a third portion of the first epitaxial layer with a second etching gas. The first and second portions have a same composition. A flow rate of the second etching gas is higher than a flow rate of the first etching gas.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method of forming an epitaxial layer on a substrate in a chamber, comprising:
    cleaning the chamber with a first etching gas;
    depositing, on the substrate, the epitaxial layer comprising:
        epitaxially growing a first portion of the epitaxial layer with a precursor;
        cleaning the substrate and the chamber with a flush of a second etching gas different from the first etching gas; and
        epitaxially growing a second portion of the epitaxial layer with the precursor, wherein the first portion and the second portion have a same composition; and
    etching a portion of the epitaxial layer with a third etching gas having a flow rate higher than that of the second etching gas.

2. The method of claim 1, wherein the etching the portion of the epitaxial layer comprises etching the epitaxial layer with the third etching gas for a time greater than a time of cleaning the substrate and the chamber with the second etching gas.

3. The method of claim 1, wherein the second etching gas comprises hydrogen chloride (HCl).

4. The method of claim 1, wherein a time of cleaning the substrate and the chamber with the second etching gas ranges from about 3 seconds to about 10 seconds.

5. The method of claim 1, further comprising baking the substrate prior to depositing the epitaxial layer in a hydrogen environment at a temperature ranging from about 800° C. to about 850° C.

6. The method of claim 1, further comprising heating the substrate with the epitaxial layer after depositing the epitaxial layer in a hydrogen environment at a temperature ranging from about 800° C. to about 850° C.

7. The method of claim 1, further comprising coating the substrate with a semiconductor seed layer comprising silicon after cleaning the chamber with the first etching gas, wherein the semiconductor seed layer has a composition different from that of the epitaxial layer.

8. The method of claim 1, wherein the cleaning the chamber with the first etching gas comprises cleaning the chamber with the first etching gas at a temperature ranging from about 1000° C. to about 1200° C.

9. A method, comprising:
    depositing, on a substrate in a chamber, a first epitaxial layer comprising:
        epitaxially growing a first portion of the first epitaxial layer with a precursor;
        cleaning the substrate and the chamber with a first etching gas; and
        epitaxially growing a second portion of the first epitaxial layer with the precursor, wherein the first portion and the second portion have a same composition;
    etching a portion of the first epitaxial layer with a second etching gas, wherein a flow rate of the second etching gas is higher than a flow rate of the first etching gas; and
    depositing, on the first epitaxial layer, a second epitaxial layer with a different composition from the first epitaxial layer.

10. The method of claim 9, wherein the etching the portion of the first epitaxial layer comprises etching the first epitaxial layer with the second etching gas for a time greater than a time of cleaning the substrate and the chamber with the first etching gas.

11. The method of claim 9, wherein the depositing the second epitaxial layer comprises cleaning the substrate and the chamber with a plurality of flushes of the first etching gas, and wherein a number of the plurality of flushes of the first etching gas during depositing the second epitaxial layer is greater than a number of flushes with the first etching gas during depositing the first epitaxial layer.

12. The method of claim 11, wherein an interval between each of the plurality of flushes of the first etching gas ranges from about 30 s to about 50 s.

13. The method of claim 11, wherein the first etching gas comprises hydrogen chloride (HCl) and a time of cleaning the substrate and the chamber with the first etching gas ranges from about 3 s to about 10 s.

14. The method of claim 9, further comprising etching the second epitaxial layer with a third etching gas comprising a silicon-based precursor, wherein a flow rate of the third etching gas is higher than the flow rate of the first etching gas and a time of etching the second epitaxial layer with the third etching gas is substantially same as a time of etching the first epitaxial layer with the second etching gas.

15. The method of claim 14, further comprising:
    depositing a third epitaxial layer on the second epitaxial layer, wherein the depositing the third epitaxial layer comprises cleaning the substrate and the chamber with the first etching gas;
    etching the third epitaxial layer with the third etching gas;
    depositing a fourth epitaxial layer on the third epitaxial layer, wherein the depositing the fourth epitaxial layer comprises cleaning the substrate and the chamber with the first etching gas;
    etching the fourth epitaxial layer with a fourth etching gas comprising a germanium-based precursor and different from the second and third etching gases; and
    heating the first, second, third, and fourth epitaxial layers in a hydrogen environment at a temperature ranging from about 800° C. to about 850° C.

16. A method, comprising:
    forming a first fin structure and a second fin structure on a substrate;
    etching a portion of the first and second fin structures; and
    forming a source/drain (S/D) epitaxial structure on the etched first and second fin structures, wherein the forming the S/D epitaxial structure comprises:
        epitaxially growing a first portion of a first epitaxial layer in a chamber with a precursor;
        cleaning the substrate and the chamber with a first etching gas;
        epitaxially growing a second portion of the first epitaxial layer with the precursor, wherein the first and second portions have a same composition; and
        etching a third portion of the first epitaxial layer with a second etching gas, wherein a flow rate of the second etching gas is higher than a flow rate of the first etching gas.

17. The method of claim 16, further comprising depositing, on the first epitaxial layer, a second epitaxial layer with a different composition from the first epitaxial layer.

18. The method of claim 17, wherein the depositing the second epitaxial layer comprises cleaning the substrate and the chamber with a plurality of flushes of the first etching gas, and wherein an interval between each of the plurality of flushes of the first etching gas ranges from about 30 s to about 50 s.

19. The method of claim 17, further comprising etching the second epitaxial layer with a third etching gas comprising a silicon-based precursor, wherein a flow rate of the third etching gas is higher than the flow rate of the first etching gas.

20. The method of claim 16, wherein the first etching gas comprises hydrogen chloride (HCl), and wherein a time of cleaning the substrate and the chamber with the first etching gas ranges from about 3 s to about 10 s.

* * * * *